United States Patent [19]
Mitchell et al.

[11] Patent Number: 5,180,974
[45] Date of Patent: Jan. 19, 1993

[54] SEMICONDUCTOR TESTING AND SHIPPING SYSTEM

[75] Inventors: Steven L. Mitchell, Boise; Warren M. Farnworth, Nampa, both of Id.

[73] Assignee: Micron Technology, Inc., Boise, Id.

[21] Appl. No.: 888,779

[22] Filed: May 26, 1992

[51] Int. Cl.⁵ ............................................. G01R 1/00
[52] U.S. Cl. ................................. 324/158 F; 206/331; 324/158 R; 439/330
[58] Field of Search ............ 324/158 P, 158 F, 158 R; 206/320, 334, 331, 332; 414/222, 225; 439/68, 70, 73, 330

[56] References Cited

U.S. PATENT DOCUMENTS

| | | | |
|---|---|---|---|
| 3,746,157 | 7/1973 | L'Anson | 206/331 |
| 4,026,412 | 5/1977 | Henson | 206/332 |
| 4,585,121 | 4/1986 | Capelli, Jr. | 206/332 |
| 4,696,526 | 9/1987 | Newton et al. | 439/68 |
| 4,717,347 | 1/1988 | Babow et al. | 439/330 |
| 4,725,918 | 2/1988 | Bakker | 206/331 |
| 4,824,392 | 4/1989 | Billman et al. | 439/73 |
| 4,872,845 | 10/1989 | Korsimspy et al. | 439/330 |
| 5,007,845 | 4/1991 | Grabbe | 439/330 |
| 5,012,924 | 5/1991 | Murphy | 206/331 |
| 5,086,269 | 2/1992 | Nobi | 324/158 F |

FOREIGN PATENT DOCUMENTS 1476624 4/1989 U.S.S.R. ............................ 439/73

Primary Examiner—Ernest F. Karlsen
Assistant Examiner—William J. Burns
Attorney, Agent, or Firm—Wayne E. Duffy

[57] ABSTRACT

An integrated system is described for testing, marking, inspecting and shipping completed semiconductor integrated circuit parts in a modified standard shipping tray by the combined use of a novel tray cover and an appropriately designed burn-in board assembly. A specially designed tray cover is placed on the modified shipping tray containing multiple integrated circuit parts which have been encapsulated and singulated. The cover is designed to hold the parts securely and precisely in specific individual location. Openings in the cover permit marking and inspecting of the parts by known means, when desired. A burn-in board is appropriately connected to the exposed leads of the parts, from beneath the tray and burn-in and other tests are conducted. Defective parts are identified and replaced. The special cover and burn-in board are removed from the shipping tray, which is then covered with a standard cover or stacked with other completed trays, to be stored or shipped.

1 Claim, 4 Drawing Sheets

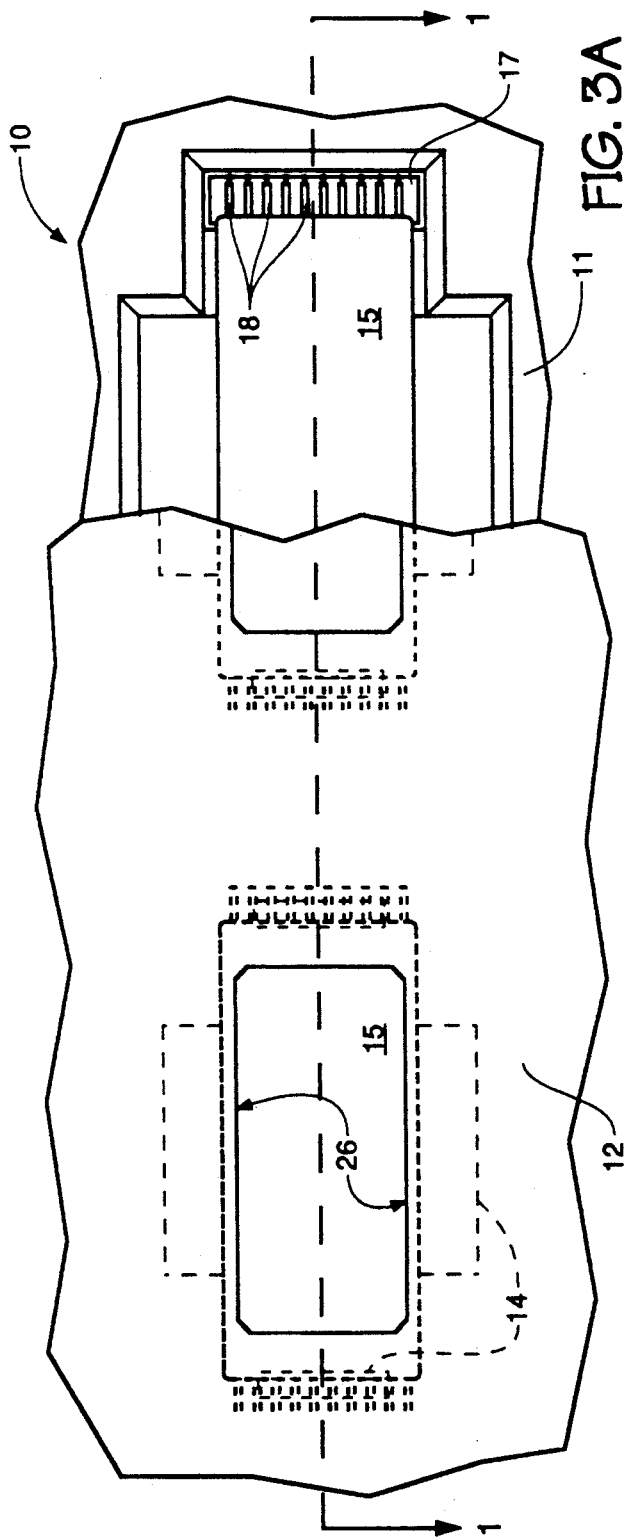
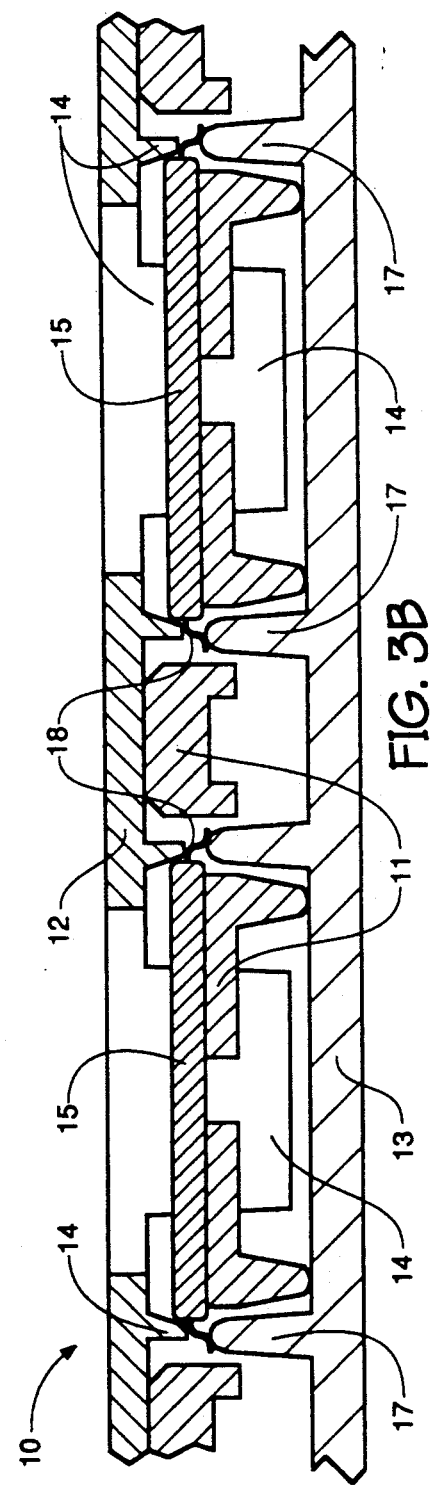
FIG. 3A
FIG. 3B

SEMICONDUCTOR TESTING AND SHIPPING SYSTEM

BACKGROUND OF THE INVENTION

1. Field of the Invention

This invention relates to the procedures and containment steps taken in inspecting, marking and testing finished semiconductor parts and preparing them for shipping.

2. Description of Prior Art

Common and conventional procedures used with finished semiconductor parts prior to shipping usually involve burn-in, testing an marking of the parts and then placement of the parts in standard containers for shipment or storage. Each of the described steps usually requires individual handling of the parts and manual transfer from one location, station or tray to another, with appropriate connection and disconnection of the parts at each point in the procedure. Such handling of the finished parts is a common source of breakage and component failure of the parts which, of course, affects the quality and performance of the finished product.

This invention seeks to minimize such failures by eliminating much of the standard handling and consolidates and simplifies the procedures taken with the final product prior to shipping.

SUMMARY OF THE INVENTION

In this invention the plastic encapsulated semiconductor parts are singulated at the trim and form steps of the assembly process and placed in a standard shipping tray of modified design, to be described, which is subsequently used for burn-in, testing, marking and shipping to the customer. Utilizing a modified industry standard tray to hold the parts also eliminates the need for a standard ring holding system, of known design, not shown. The tray may be modified further by the user for special purposes.

A specially designed tray cover, which is an integral part of this invention, to be described, is utilized to secure the semiconductor parts precisely and accurately within the modified shipping tray, while permitting access to the parts, from above, for inspection and marking and allowing the locating and locking of the tray onto a special burn-in board, from below, which connects to the exposed leads of the parts and permits burn-in and testing of the parts while they are resting in the shipping tray.

When appropriate, shipping trays may be stacked on top of each other in a customary way and a single standard, unmodified cover, of known design, may be used for a single shipping tray or a selected package of stacked trays. Since the special cover is of little or no use to the customer, ordinarily, it may be retained for repeated use, thus reducing costs.

Use of the special cover, in this invention, eliminates placement of the semiconductor devices from the tray into burn-in carriers, placement of carriers into burn-in sockets in the "mother board", removal of the individual carriers from the burn-in socket and removal of the individual semiconductor device from the carrier and its placement into the shipping tray.

The elimination of such handling serves to lessen the chances for device breakage, loss and electrical failure, thus improving overall product integrity and rate of output.

DESCRIPTION OF THE DRAWINGS

FIG. 3A is a top schematic view of a plurality of die sitting on a modified tray with a cutaway view showing detail of end leads of a die and end and side configuration of the special cover covering the integrated circuit parts.

FIG. 3B is a side schematic view showing detail of section 1—1 of FIG. 3A with the special cover, the integrated circuit parts, the special tray and the special burn-in board in position for operation of the system.

DESCRIPTION OF THE PREFERRED EMBODIMENTS

In each of the preferred embodiments, to be described, the special cover is placed upon the modified shipping tray bearing the integrated circuit parts. The configuration of the cover generally matches that of the tray, with appropriate uniform, generally rectangular, openings located in the cover which expose accurately and precisely, the top surfaces of the integrated circuit parts, for inspection and marking. The openings are made to match the particular tray and part being held herein, whether end connections or side connections, so that when the special cover is placed upon the parts in the tray, they are held down by the cover and the leads are also accessible for connection to the special burn-in board from beneath the tray. The burn-in board is then placed in matching position beneath the tray, with appropriate raised, ribbon type connection terminals from the burn-in board touching leads on the plurality of die, in order to conduct the burn-in and other tests when the burn-in board is connected to an appropriate external power supply, not shown. The tray is held upon the burn-in board in a standard, known, existing manner by two fixed keys and two adjustable keys, located on adjacent sides of the tray which fit into matching key slots on the burn-in board. This method of key-slot attachment is not a novel part of this invention.

FIG. 3A shows a cutaway view of a modified integrated circuit parts tray, with the parts having end connections exposed through existing openings in the tray. Multiple small protrusions extend downward, from the underside of the cover, in matching configuration with the opposing ends and opposing sides of the integrated circuit parts and are tapered outward slightly, away from the parts, to touch the sides and ends of the integrated circuit parts when the special cover is in place and to press down upon and confine, respectively the opposing ends and sides of the parts and hold them precisely and firmly in the X-X and Y-Y directions of the horizontal plane of the parts tray, as seen in FIG. 3B.

Figure 4:
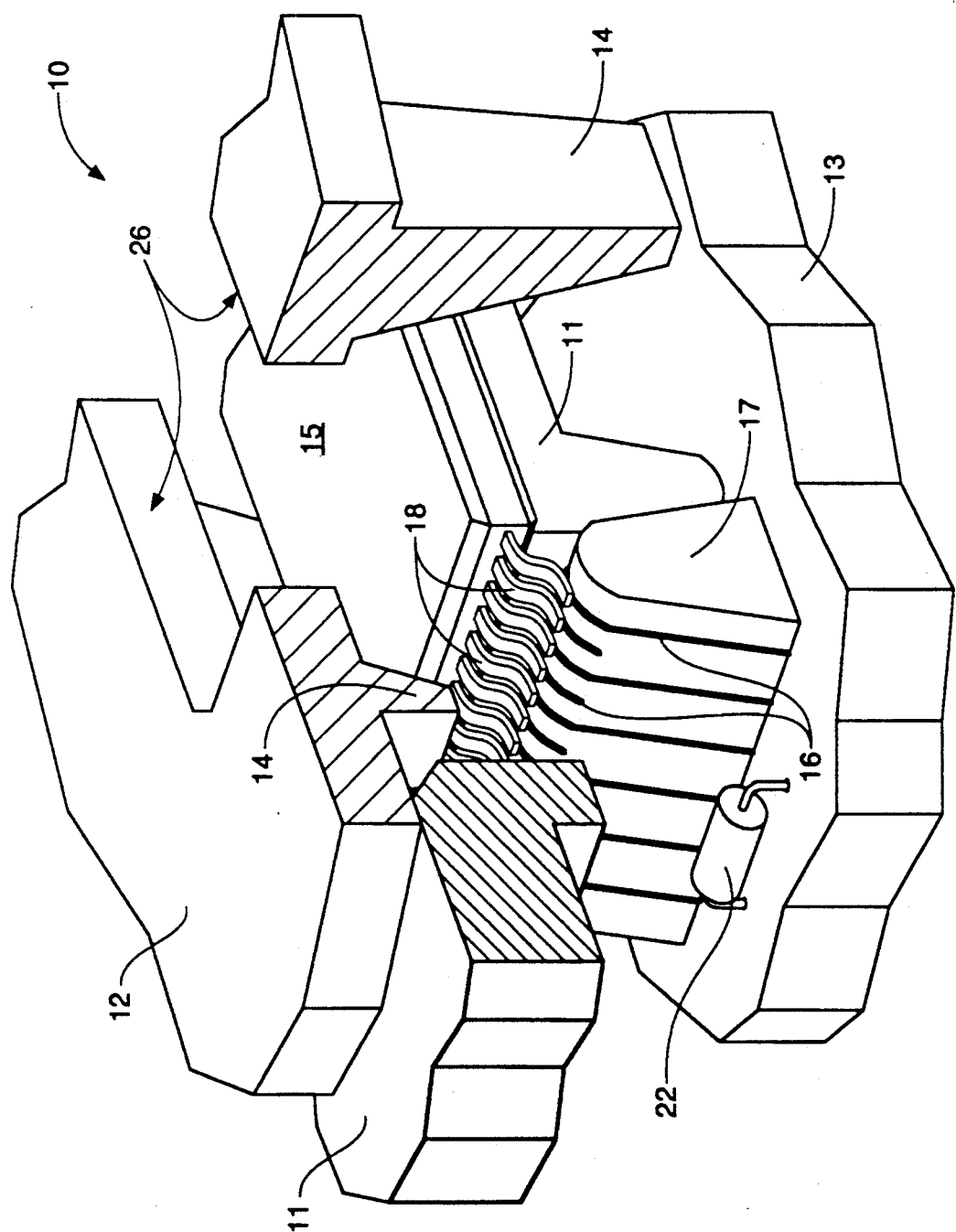
FIG. 4 shows an isometric detail of the assembled system, with the special cover, the modified shipping tray, the integrated circuit parts and a fused special burn-in board in place.

FIG. 4 shows a cutaway isometric view of the modified tray 11, special cover 12 and fused special burn-in board 13, with the tapered protrusions 14 of the cover holding and securing the integrated circuit parts 15 in position on the tray (and is designated generally by the numeral 10.)

Referring again to FIG. 4, the special burn-in board is placed beneath the tray in matching and touching configuration, so that the ribbon type leads 16 of the burn-in board which rest upon integral raised saddles 17, match and touch the leads 18 on the integrated circuit parts sitting in the tray, to form an electrical circuit with the burn-in board 13 when it is attached, removably, electrically and operably to an external power supply, not shown, for burn-in and testing of the parts.

Typical use and function of the system 10, consisting of the special cover 12 multiple standard integrated circuit parts 15, modified standard shipping tray 11 and special burn-in board 13, may be described as follows:

1) A modified, standard integrated circuit (IC) parts shipping tray, of known design, with appropriately located indexing openings 19, is filled with designated encapsulated and singulated parts 15. The tray is designed to hold either, but not both, end-connected 20 or side-connected parts 21, in the two preferred embodiments.

2) A specially designed and conforming cover 12 is placed upon the modified tray 11 containing the IC parts 15. This cover is designed to hold down and secure precisely and accurately, from above, the parts which are resting upon the modified shipping tray.

Figure 1:
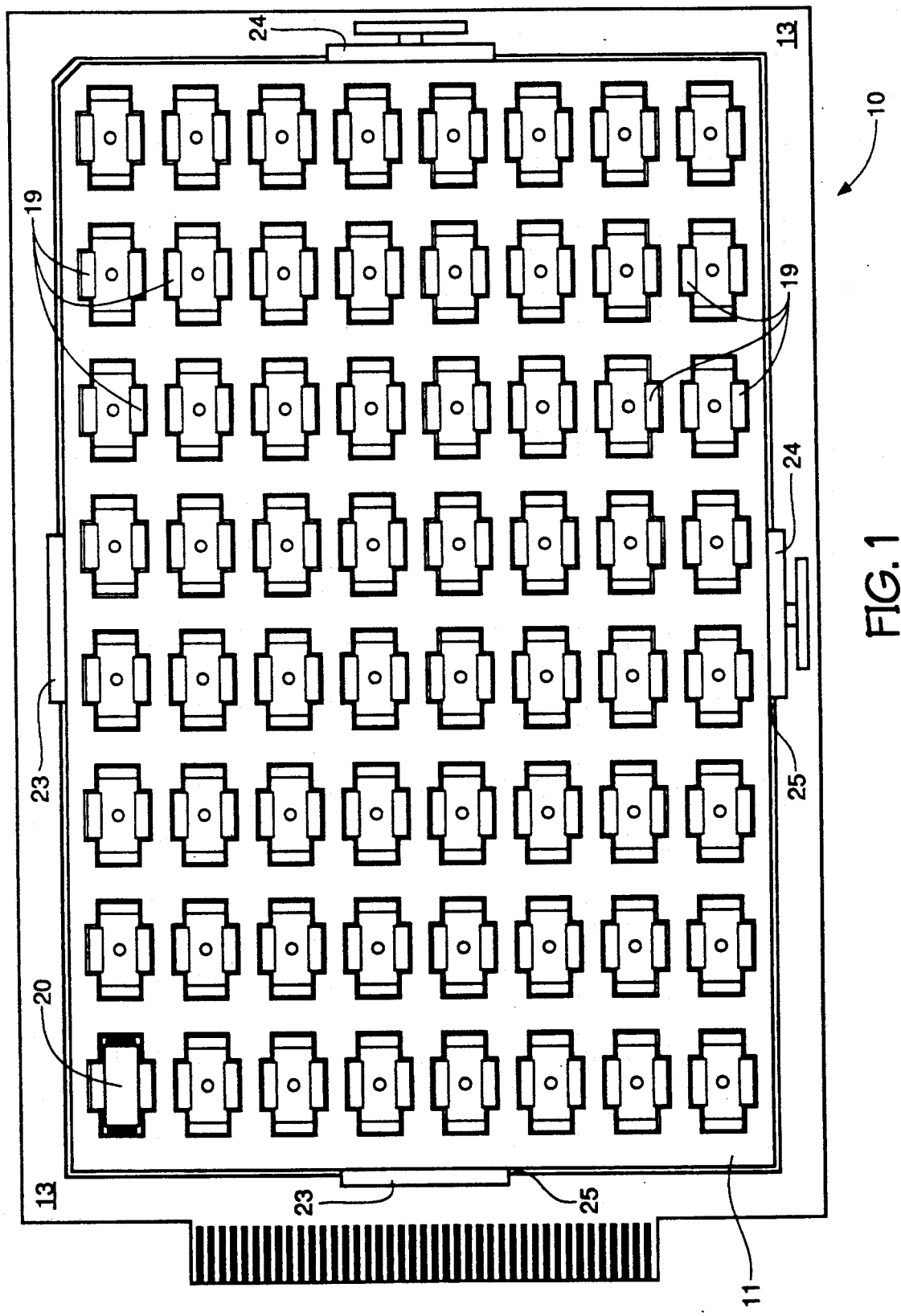
FIG. 1 is a top schematic view of a modified Type I parts tray showing a typical section with end connections on the integrated circuit parts and indexing openings on the sides.
Figure 2:
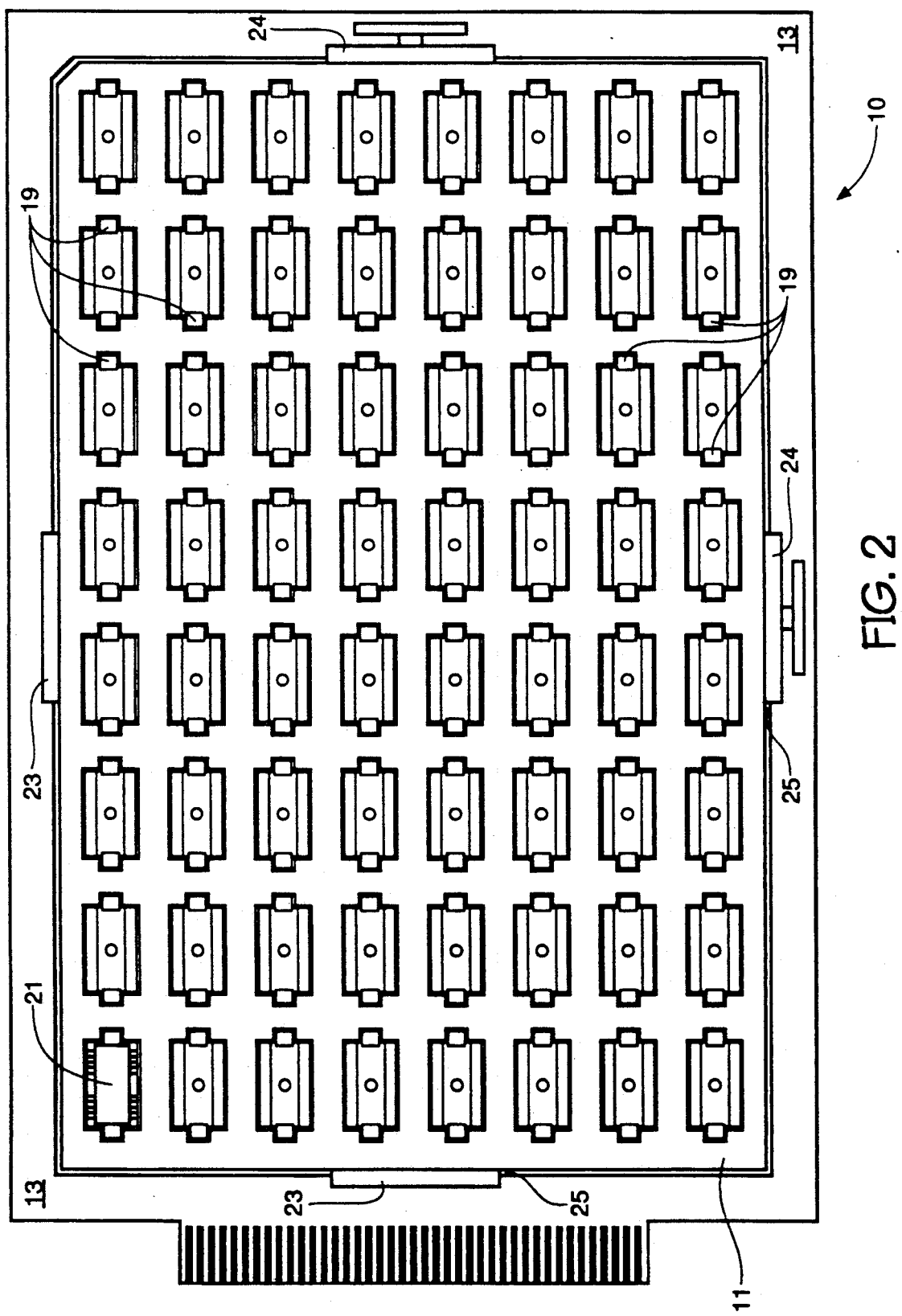
FIG. 2 is a top schematic view of a modified Type II parts tray showing a typical section with side connections on the integrated circuit parts and indexing openings on the ends.

3) The modified shipping tray, included IC parts and attached cover are removably placed upon a special, fused 22, burn-in board 13. The tray is held securely thereon by two fixed keys 23 and two adjustable keys 24 which are integral, known, parts of a standard shipping tray and which fit, removably, into matching key slots 25 in the burn-in board, as seen in FIGS. 1 and 2. The multiple, ribbon type electrical leads 16 on the fused, special burn-in board rest on raised saddles 17 which are integral to the board, on one end, and are placed in touching relationship, in an appropriate and matching and operable configuration with the multiple leads on the plurality of IC parts resting on the shipping tray. The raised saddles supporting the ribbon contacts eliminate the sockets common to many burn-in boards and are necessary to implement the preferred embodiments. Other obvious designs may be chosen by the user.

4) The opposing ends of the multiple ribbon leads on the burn-in board are connected electrically and appropriately, in a known way, to an external power supply, not shown, and the IC parts are individually and collectively burned-in and tested.

5) The multiple uniform openings 26 in the cover which expose the top surfaces of the multiple integrated circuit parts allow access for further inspection and marking of the parts, in known ways.

6) The special cover and the special burn-in board are then removed from the modified tray and the tray is covered with an unmodified standard cover, not shown, of known design or placed in a stack of other trays containing finished parts and prepared for further processing, storage or shipping.

The terminals described in the preferred embodiments for the various parts and the special burn-in board are generally of the known strip or ribbon type but may be of the pogo-pin or other known type whenever appropriate to the integrated circuit being processed or to the needs of the user. The burn-in board may be fused or not, as desired.

The present invention has been described in two preferred embodiments which use current technology. A special cover, of novel design, is described which is employed to cover a standard shipping tray which has been modified by the introduction of precise indexing openings adjacent to the sides of multiple integrated parts placed in the tray. The special cover, the modified tray and a special burn-in board are then combined, as described above to form a novel system to inspect, mark and test multiple integrated circuit parts and ship them, with a minimum of handling. Many modifications and variations may become apparent to those skilled in the art. However the scope of the invention is not limited by the above described details but only by the appended claims.

We claim:

1. An integrated system for testing, marking, inspecting and shipping completed semiconductor parts, said system comprising:

a) a shipping tray of suitable, known shape, size and composition and designed to contain a plurality of standard encapsulated and singulated integrated circuit parts, having generally parallel top and bottom surfaces, appropriately and individually placed therein, in a known way, for ultimate shipping, with the exposed leads on opposing sides of said parts being aligned uniformly with those of adjoining parts in standard parallel, spaced and planar relationship to each other;

b) said tray having a plurality of uniform indexing openings located immediately adjacent to opposing sides of said parts not having leads extending therefrom,, to permit precise placement and indexing of a special shipping tray cover to be placed on top of said tray after the parts are put in said tray;

c) the special shipping tray cover being of similar composition and generally matching configuration with the shipping tray and having a plurality of uniform openings in said cover which allow easy access to each of the top surfaces of the parts, for marking and inspecting said parts, when appropriate, and access to the exposed leads of the parts, when the cover is placed on top of the tray;

d) said shipping tray cover having a first, top, generally flat surface and a second, bottom and generally parallel surface, with a plurality of uniformly shaped protrusions extending downward therefrom, located precisely and accurately to enter the indexing openings in the shipping tray and designed to hold down and secure precisely in place, from above, each of the plurality of integrated circuit parts which are resting in the shipping tray;

e) said shipping tray also having a typical fixed indexing key, of known design, on each of two adjacent sides and a typical adjustable indexing key, of known design, on each of two other adjacent sides of said tray, in order to removably and precisely and accurately and operably secure said tray upon an appropriate burn-in board, having matching indexing key slots appropriately located on the periphery of the burn-in board f) said burn-in board having, on one end, multiple leads removably and operably attachable, in a known way, to the multiple leads of the plurality of integrated circuit parts and on the opposing end to an external power supply, of known design, to perform appropriate burn-in and tests upon the plurality of integrated circuit parts contained in the shipping tray and held precisely and accurately in position by the shipping tray cover, during such burn-in and testing; and g) upon completion of standard marking, burn-in and testing, said special cover and burn-in board are removed from said shipping tray containing the integrated circuit parts and the tray is covered with a standard cover, stacked with other completed trays if appropriate and shipped.

* * * * *